(12) United States Patent
Tamura et al.

(10) Patent No.: US 9,935,601 B2
(45) Date of Patent: Apr. 3, 2018

(54) LC PARALLEL RESONANT ELEMENT

(71) Applicant: Murata Manufacturing Co., Ltd., Nagaokakyo-shi, Kyoto-fu (JP)

(72) Inventors: Wataru Tamura, Nagaokakyo (JP); Kuniaki Yosui, Nagaokakyo (JP); Jun Sasaki, Nagaokakyo (JP); Noboru Kato, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 0 days.

(21) Appl. No.: 14/844,440

(22) Filed: Sep. 3, 2015

(65) Prior Publication Data

US 2015/0381138 A1     Dec. 31, 2015

Related U.S. Application Data

(63) Continuation of application No. PCT/JP2014/061359, filed on Apr. 23, 2014.

(30) Foreign Application Priority Data

May 9, 2013   (JP) ................................ 2013-098946

(51) Int. Cl.
    *H03H 7/01*     (2006.01)
    *H01F 38/14*    (2006.01)
    (Continued)

(52) U.S. Cl.
    CPC ....... *H03H 7/0161* (2013.01); *H01F 17/0013* (2013.01); *H01F 38/14* (2013.01);
    (Continued)

(58) Field of Classification Search
    CPC ..................... H03H 2001/0085; H03H 7/0115
    (Continued)

(56) References Cited

U.S. PATENT DOCUMENTS 5,530,411 A * 6/1996 Nakata ................ H03H 1/0007
    333/185
5,945,892 A * 8/1999 Kato .................... H03H 7/0115
    333/185

(Continued)

FOREIGN PATENT DOCUMENTS

JP    3-254513 A    11/1991
JP    03-274814 A    12/1991
(Continued)

OTHER PUBLICATIONS

Official Communication issued in International Patent Application No. PCT/JP2014/061359, dated Jul. 22, 2014.

(Continued)

*Primary Examiner* — Robert J Pascal
*Assistant Examiner* — Rakesh Patel
(74) *Attorney, Agent, or Firm* — KEATING & BENNETT, LLP

(57) ABSTRACT

An LC parallel resonant element includes a first planar or substantially planar conductor on a first base material layer and second and third planar or substantially planar conductors on second and third base material layers. The first and third planar or substantially planar conductors extend over nearly the entire surfaces of the first and third base material layers. The second planar or substantially planar conductor extends over nearly the entire length of the second base material layer in a second direction such that a space from the other end portion of two end portions of a multilayer body in a first direction is provided. The first and third planar or substantially planar conductors are connected to each other by interlayer conductors near the other end portion of the multilayer body. The first and second planar or substantially planar conductor are connected to each other by (Continued)

interlayer conductors near one end portion of the multilayer body.

21 Claims, 17 Drawing Sheets

(51) Int. Cl.
*H03H 5/12* (2006.01)
*H01F 17/00* (2006.01)
*H03H 1/00* (2006.01)

(52) U.S. Cl.
CPC ............ *H03H 5/12* (2013.01); *H03H 7/0115* (2013.01); *H03H 7/1766* (2013.01); *H01F 2017/0026* (2013.01); *H01F 2038/146* (2013.01); *H03H 2001/0085* (2013.01); *H03H 2007/013* (2013.01)

(58) Field of Classification Search
USPC .................................. 333/175, 185; 336/200
See application file for complete search history.

(56) References Cited

U.S. PATENT DOCUMENTS

| | | | | |
|---|---|---|---|---|
| 6,115,264 | A | * | 9/2000 | Nosaka ............... H01F 17/0013 333/172 |
| 2005/0077984 | A1 | * | 4/2005 | Lee ....................... H01P 1/2039 333/204 |
| 2008/0055017 | A1 | * | 3/2008 | Shafer .................. H03H 7/0115 333/132 |
| 2010/0259344 | A1 | | 10/2010 | Nosaka |
| 2011/0140806 | A1 | | 6/2011 | Taniguchi |
| 2012/0313730 | A1 | * | 12/2012 | Ootsuka .............. H01P 1/20345 333/185 |
| 2012/0319801 | A1 | * | 12/2012 | Taniguchi ............ H03H 7/0115 333/185 |
| 2014/0240061 | A1 | * | 8/2014 | Imamura .............. H03H 7/1775 333/185 |

FOREIGN PATENT DOCUMENTS

| | | |
|---|---|---|
| JP | 5-283903 A | 10/1993 |
| JP | 2000-165171 A | 6/2000 |
| JP | 2000-196391 A | 7/2000 |
| JP | 2001-345661 A | 12/2001 |
| JP | 2005-117176 A | 4/2005 |
| JP | 2008-182598 A | 8/2008 |
| JP | 2011-124880 A | 6/2011 |
| WO | 2009/090917 A1 | 7/2009 |

OTHER PUBLICATIONS

Official Communication issued in corresponding Japanese Patent Application No. 2015-229502, dated Aug. 30, 2016.

* cited by examiner

LC PARALLEL RESONANT ELEMENT

BACKGROUND OF THE INVENTION

1. Field of the Invention

The present invention relates to an LC parallel resonant element including a parallel resonant circuit that includes an inductor and a capacitor and is located in a multilayer body.

2. Description of the Related Art

In the past, various kinds of LC parallel resonant elements each formed by embedding an inductor and a capacitor in a multilayer body have been devised. The multilayer body is formed by stacking dielectric layers. A conductor pattern is formed in each dielectric layer and conductor patterns in respective different dielectric layers are connected to each other via interlayer conductors. As a result, the inductor and the capacitor are formed in the multilayer body.

Usually the capacitor is formed by flat conductors formed in respective different dielectric layers and these flat conductors are arranged so as to face each other.

As illustrated in, for example, Japanese Unexamined Patent Application Publication No. 2000-196391, the inductor is formed by loop shaped linear conductors formed in respective dielectric layers and interlayer conductors linking these linear conductors together. As a result, a spiral shaped inductor whose axis direction corresponds to a stacking direction is formed.

However, since the inductor described in Japanese Unexamined Patent Application Publication No. 2000-196391 is configured by the linear conductors, a line width is small and the Q value of the inductor is low. Therefore, the Q value of an LC parallel resonant element including this inductor is decreased.

SUMMARY OF THE INVENTION

Accordingly, preferred embodiments of the present invention provide an LC parallel resonant element having a high Q value while including a multilayer body.

According to a preferred embodiment of the present invention, an LC parallel resonant element includes a multilayer body, first and second terminals, a first planar or substantially planar conductor, and a plurality of second planar or substantially planar conductors and further includes the following configuration. The multilayer body includes a plurality of base material layers stacked on top of one another. Each of the base material layers has an insulation property. The first terminal and the second terminal are arranged separately from each other in a first direction of the multilayer body on one main surface of the multilayer body. The first planar or substantially planar conductor has a shape that links the first terminal and the second terminal to each other at a shortest distance. The second planar or substantially planar conductors are provided on layers different from a base material layer on which the first planar or substantially planar conductor is arranged. The second planar or substantially planar conductors face each other in a stacking direction of the multilayer body. The LC parallel resonant element further includes a first interlayer conductor that is extended in the stacking direction and continuously connects one of the pair of second planar or substantially planar conductors and the first terminal to each other and a second interlayer conductor that is extended in the stacking direction and continuously connects the other of the pair of second planar or substantially planar conductors and the second terminal to each other.

In this configuration, the first planar or substantially planar conductor defines and functions as an inductor. Two out of the second planar or substantially planar conductors and a corresponding base material layer sandwiched between the two second planar or substantially planar conductors define and function as a capacitor. As a result, the inductor and the capacitor are connected in parallel to each other between the first terminal and the second terminal. Here, in the inductor, a distance between the first terminal and the second terminal, in other words, a line length to transmit a high-frequency signal is short, and the inductor is long in a direction perpendicular to a transmission direction (the direction perpendicular to the first direction). In other words, an inductor whose line length is short and whose line width is wide is provided. As a result, the Q value of the inductor becomes high and the Q value of the LC parallel resonant element becomes high.

According to preferred embodiments of the present invention, it is preferable that, in the LC parallel resonant element, a space between a planar or substantially planar conductor out of the second planar or substantially planar conductors and the first planar or substantially planar conductor is wider than a space between the second planar or substantially planar conductors facing each other and that the planar or substantially planar conductor is located on a side near the first planar or substantially planar conductor.

In this configuration, it is possible to prevent electric field coupling between the first planar or substantially planar conductor and the second planar or substantially planar conductors, the first planar or substantially planar conductor defining the inductor. As a result, it is possible to prevent the parasitic capacitor of the inductor, and it is possible to further improve the Q value of the inductor, thus making it possible to further improve the Q value of the LC parallel resonant element.

According to a preferred embodiment of the present invention, it is preferable that the LC parallel resonant element includes the following configuration. The LC parallel resonant element includes a multilayer body, first and second terminals, a plurality of planar or substantially planar conductors, and interlayer conductors. The multilayer body includes a plurality of base material layers stacked on top of one another. Each of the base material layers has an insulation property. The first terminal and the second terminal are arranged on an outer surface of the multilayer body. The planar or substantially planar conductors are provided at different positions in a stacking direction of the multilayer body and each have a plane surface perpendicular to the stacking direction. The interlayer conductors continuously connect the planar or substantially planar conductors between the first terminal and the second terminal.

In this configuration, a continuous line defined by the planar or substantially planar conductors and the interlayer conductors defines and functions as an inductor. In addition, portions facing each other in the stacking direction in the planar or substantially planar conductors define and function as a capacitor. As a result, the inductor and the capacitor are connected in parallel to each other between the first terminal and the second terminal. Here, the inductor is long in a direction perpendicular to the transmission direction of a high-frequency signal. In other words, an inductor whose line width is wide is provided. As a result, the Q value of the inductor becomes high and the Q value of the LC parallel resonant element becomes high.

In addition, according to a preferred embodiment of the present invention, it is preferable that the LC parallel resonant element includes the following configuration. The number of the planar or substantially planar conductors is preferably three or more. One planar or substantially planar conductor, located on a central side in the stacking direction, out of two planar or substantially planar conductors adjacent to each other in the stacking direction is smaller in area than the other. The interlayer conductors are configured and arranged so that a planar or substantially planar conductor located at a position at which the planar or substantially planar conductor is sandwiched between paired planar or substantially planar conductors connected by the interlayer conductors is surrounded by the paired planar or substantially planar conductors and the interlayer conductors connecting the paired planar or substantially planar conductors.

In this configuration, when the multilayer body is viewed in a direction (a second direction to be described later) perpendicular to the first direction, the inductor configured by the planar or substantially planar conductor and the interlayer conductors has a spiral or substantially spiral shape. Accordingly, compared with a case of being formed using another shape, for example, a substantially meander shape, it is possible to increase the Q value of the inductor.

In addition, according to a preferred embodiment of the present invention, it is preferable that the LC parallel resonant element includes the following configuration. Lengths of the planar or substantially planar conductors in the second direction perpendicular to the first direction and the stacking direction are equal or substantially equal to lengths of the respective base material layers in the second direction. In this configuration, within a range of being able to be formed in the multilayer body, it is possible to configure an inductor whose line width is as wide as possible. As a result, it is possible to further increase the Q value of the inductor.

According to a preferred embodiment of the present invention, it is preferable that, in the LC parallel resonant element, lengths of the planar or substantially planar conductors in the first direction are shorter than the respective lengths thereof in the second direction.

In this configuration, an inductor whose line length is short and whose line width is wide is provided. As a result, it is possible to further increase the Q value of the inductor.

According to a preferred embodiment of the present invention, it is preferable that, in the LC parallel resonant element, the base material layers are formed of liquid crystalline polymer, for example. Since, in this configuration, the LC parallel resonant element is configured using a material whose dielectric loss tangent is small, it is possible to further increase the Q value.

In addition, according to a preferred embodiment of the present invention, it is preferable that a band elimination filter includes one of the LC parallel resonant elements described above and the resonant frequency of the relevant LC parallel resonant element is set as an attenuation pole frequency.

Since this configuration includes the LC parallel resonant element whose Q value is high, it is possible to provide a band elimination filter whose attenuation characteristic is steep and whose attenuation band width is narrow.

Note that any planar conductor of various preferred embodiments of the present invention may be a substantially planar conductor.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1A:
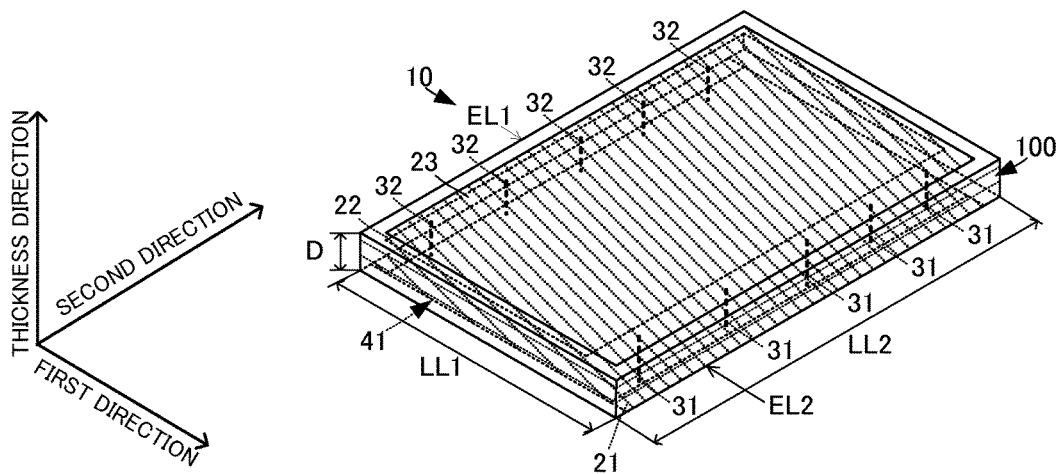
FIGS. 1A and 1B are an external perspective view and an exploded perspective view, respectively, of an LC parallel resonant element according to a first preferred embodiment of the present invention.
Figure 1B:
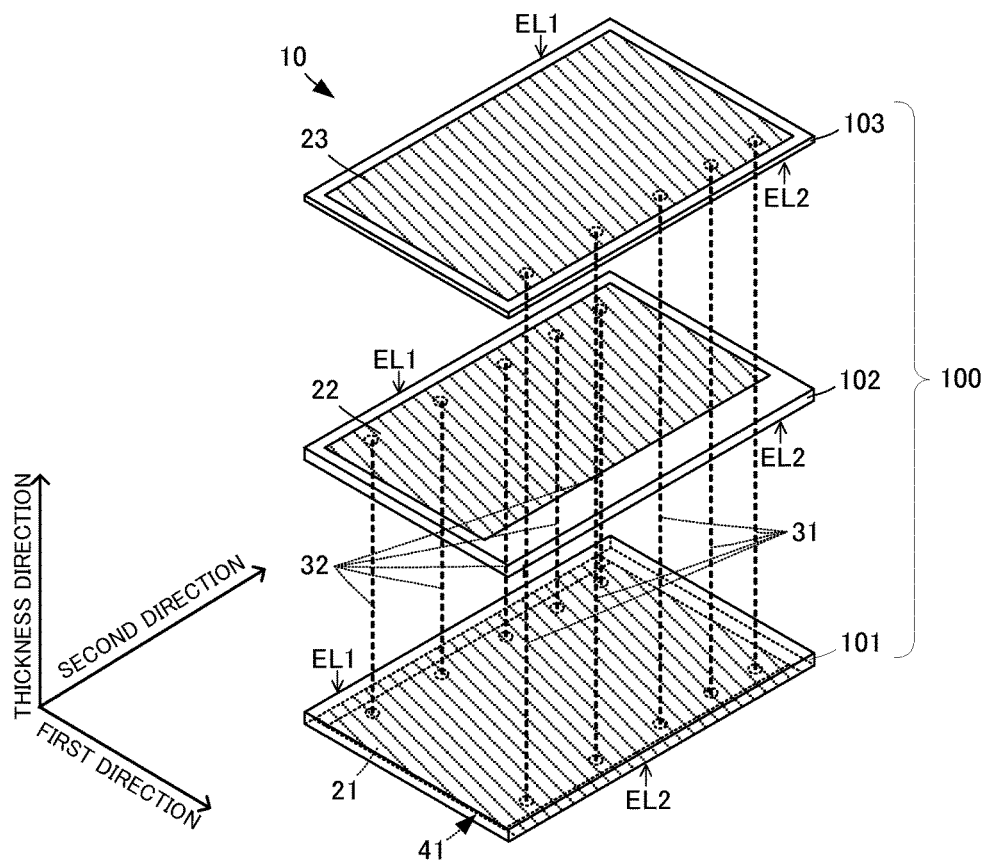
Figure 2A:
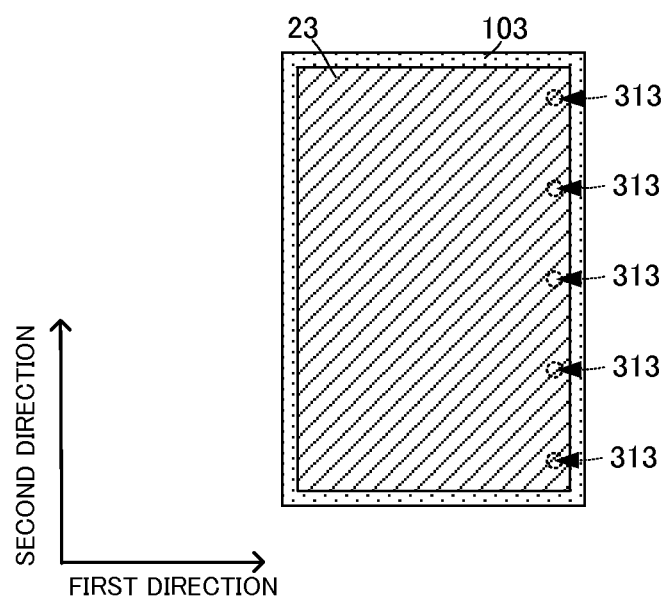
FIGS. 2A to 2C are diagrams in which respective base material layers of the LC parallel resonant element according to the first preferred embodiment of the present invention are viewed in plan.
Figure 2B:
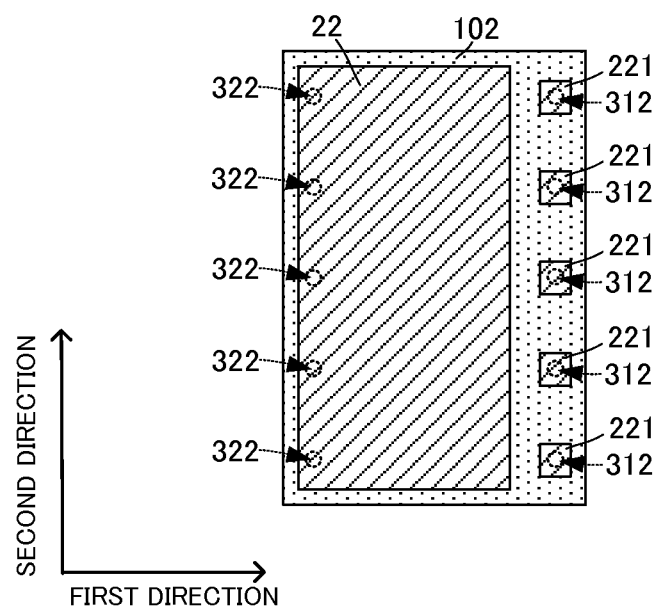
Figure 2C:
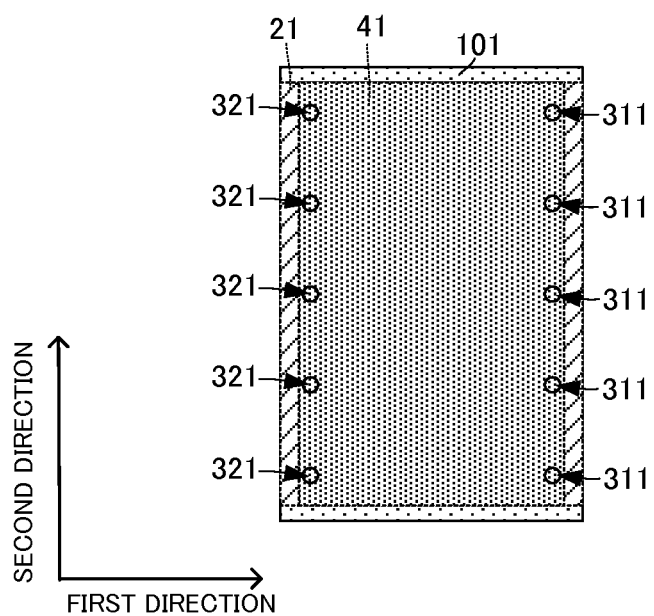
Figure 3A:
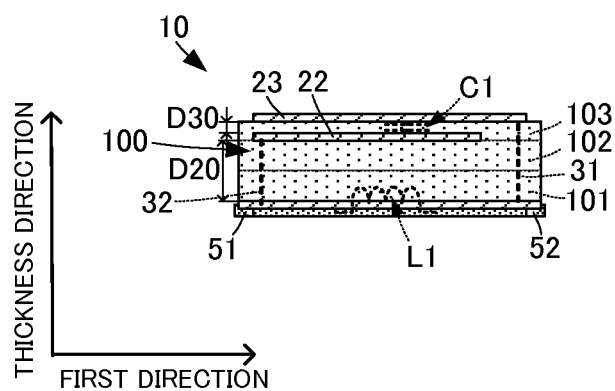
FIGS. 3A and 3B are a side cross-sectional view and an exploded view of the side cross-section, respectively, of the LC parallel resonant element according to the first preferred embodiment of the present invention.
Figure 3B:
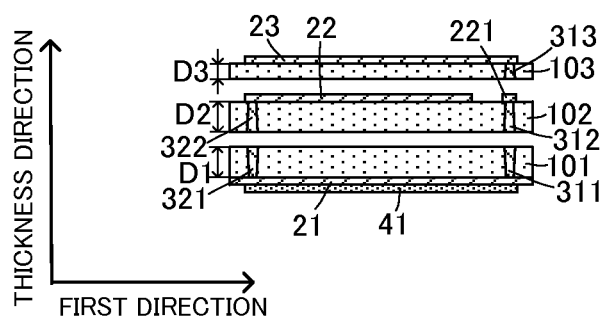
Figure 4:
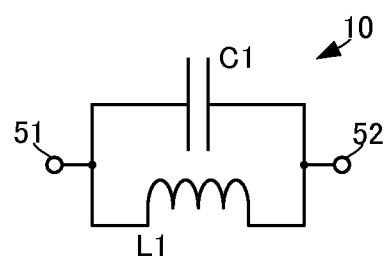
FIG. 4 is an equivalent circuit diagram of the LC parallel resonant element according to the first preferred embodiment of the present invention.
Figure 5:
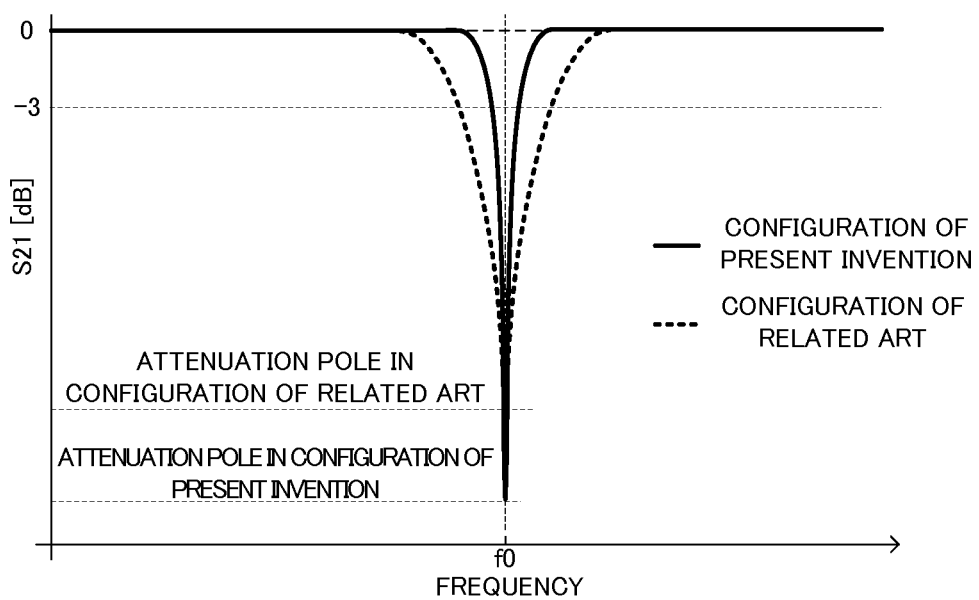
FIG. 5 is a graph illustrating transmission characteristics of the LC parallel resonant element according to the first preferred embodiment of the present invention and an LC parallel resonant element of the related art.

An LC parallel resonant element according to a first preferred embodiment of the present invention will be described with reference to drawings. FIG. 1A is an external perspective view of the LC parallel resonant element according to the first preferred embodiment of the present invention. FIG. 1B is an exploded perspective view of the LC parallel resonant element according to the first preferred embodiment of the present invention. FIGS. 2A to 2C are diagrams in which respective base material layers of the LC parallel resonant element according to the first preferred embodiment of the present invention are viewed in plan. FIG. 3A is a side cross-sectional view of the LC parallel resonant element according to the first preferred embodiment of the present invention. FIG. 3B is an exploded view of the side cross-section of the LC parallel resonant element according to the first preferred embodiment of the present invention. FIG. 4 is an equivalent circuit diagram of the LC parallel resonant element according to the first preferred embodiment of the present invention. FIG. 5 is a graph illustrating transmission characteristics of the LC parallel resonant element according to the first preferred embodiment of the present invention and an LC parallel resonant element of the related art.

As illustrated in FIG. 1A, an LC parallel resonant element 10 according to the first preferred embodiment of the present invention includes a multilayer body 100. The multilayer body 100 has a plate shape or substantially plate shape of a thickness D. The plate or substantially plate shaped surface (a planar or substantially planar surface perpendicular to the thickness D) of the multilayer body 100 is a rectangular or substantially rectangular shape that extends in a first direction and a second direction perpendicular to each other. In this case, it is preferable that, as illustrated in FIGS. 1A and 1B, a length LL1 in the first direction is shorter than a length LL2 in the second direction (LL2>LL1). Note that the length LL2 in the second direction is longer than the thickness D (LL2>D). As a specific example of dimensions, the LL1 preferably is about 0.5 mm, the LL2 is about 2.5 mm, and the D is about 0.3 mm, for example.

As illustrated in FIG. 1B, the multilayer body 100 includes base material layers 101, 102, and 103. The base material layers 101, 102, and 103 are formed of an insulating material and formed of, for example, liquid crystalline polymer. The base material layers 101, 102, and 103 are stacked in order of the base material layer 101, the base material layer 102, and the base material layer 103 from the bottom surface side of the multilayer body 100, in a direction perpendicular to the plate shaped or substantially plate shaped surface. The multilayer body 100 preferably is formed by subjecting the base material layer 101, the base material layer 102, and the base material layer 103 to thermocompression bonding.

On the bottom surface of the base material layer 101, a planar or substantially planar conductor 21 is provided. The planar or substantially planar conductor 21 corresponds to a "first planar conductor" and is preferably formed of a conductive material such as copper foil, for example. The planar or substantially planar conductor 21 is disposed over nearly the entire surface of the bottom surface of the base material layer 101. As illustrated in FIG. 1B and FIG. 2C, in a configuration illustrated in the present preferred embodiment, the planar or substantially planar conductor 21 is configured and arranged so that end portions of the planar or substantially planar conductor 21 are arranged with spaces on a central side from two respective end portions of the base material layer 101 in the second direction. The spaces are, for example, about 10 μm to 50 μm. Note that the spaces do not have to be provided. In other words, the planar or substantially planar conductor 21 may be provided over the entire surface of the bottom surface of the base material layer 101.

Furthermore, on the bottom surface of the base material layer 101, a resist film 41 of insulation is provided. The resist film 41 preferably has a shape that causes one end portion EL1's side and the other end portion EL2's side of the planar or substantially planar conductor 21 to be exposed and covers the central portion of the planar or substantially planar conductor 21.

As illustrated in FIG. 3A, at an exposed portion on the one end portion EL1's side of the planar or substantially planar conductor 21, an external connection conductor 51 is provided. This external connection conductor 51 corresponds to a first terminal. As illustrated in FIG. 3A, in an exposed portion on the other end portion EL2's side of the planar or substantially planar conductor 21, an external connection conductor 52 is provided. This external connection conductor 52 corresponds to a second terminal. Note that the external connection conductors 51 and 52 may be omitted and in this case, the exposed portion on the one end portion EL1's side of the planar or substantially planar conductor 21 corresponds to the first terminal and the exposed portion on the other end portion EL2's side of the planar or substantially planar conductor 21 corresponds to the second terminal. In addition, by arbitrarily performing plating processing on the exposed portion on the EL1's side and the exposed portion on the EL2's side, the external connection conductors 51 and 52 may be provided.

On the surface of the base material layer 102, a planar or substantially planar conductor 22 is provided. The planar or substantially planar conductor 22 corresponds to one of "second substantially planar conductors". As illustrated in FIG. 1B and FIG. 2B, the planar or substantially planar conductor 22 extends over nearly the entire length in the second direction. In this case, in the same way as the planar or substantially planar conductor 21, the planar or substantially planar conductor 22 is configured and arranged so that end portions of the planar or substantially planar conductor 22 are arranged with spaces on a central side from two respective end portions of the base material layer 102 in the second direction.

In addition, the planar or substantially planar conductor 22 preferably has a shape in which a space from one end portion EL1 of two end portions of the base material layer 102 in the first direction to one of two end portions of the planar or substantially planar conductor 22 is provided (a conductor non-formation portion is provided) and a space from the other end portion EL2 of the base material layer 102 in the first direction to the other end portion of the planar or substantially planar conductor 22 is provided (a conductor non-formation portion is provided). In this case, the space on the other end portion EL2's side is set to a dimension with which it is possible to form interlayer conductors 31 to be described later. As a result, the planar or substantially planar conductor 22 is smaller in area than a planar or substantially planar conductor 23 to be described later.

On the surface of the base material layer 103, the planar or substantially planar conductor 23 is provided. The planar or substantially planar conductor 23 corresponds to one of the "second substantially planar conductors" and is formed of a conductive material such as copper foil. As illustrated in FIG. 1B and FIG. 2A, the planar or substantially planar conductor 23 extends over nearly the entire length in the second direction. In this case, in the same way as the planar or substantially planar conductor 21, the planar or substantially planar conductor 23 is configured and arranged so that end portions of the planar or substantially planar conductor 23 are arranged with spaces on a central side from two respective end portions of the base material layer 103 in the second direction. In addition, the planar or substantially planar conductor 23 is configured and arranged so that end portions of the planar or substantially planar conductor 23 are arranged with spaces on a central side from two respective end portions of the base material layer 103 in the first direction. It is preferable that the spaces are, for example, about 10 μm to about 50 μm.

As illustrated in FIGS. 1A and 1B and FIG. 3A, the planar or substantially planar conductor 21 and the planar or substantially planar conductor 23 are connected via the interlayer conductors 31 extended in a stacking direction of the multilayer body 100. The interlayer conductors 31 are arranged in the vicinity of the other end portion EL2 of two end portions of the multilayer body 100 and spaces are provided therebetween in the second direction.

Specifically, as illustrated in FIGS. 2A to 2C and FIG. 3B, the interlayer conductors 31 each include a via conductor 311 that penetrates the base material layer 101 in a thickness direction, a via conductor 312 that penetrates the base material layer 102 in the thickness direction, an auxiliary conductor pattern 221 provided on the surface of the base material layer 102, and a via conductor 313 that penetrates the base material layer 103 in the thickness direction, and these are linked in the stacking direction, thus forming the corresponding interlayer conductor 31. In the same way as the planar or substantially planar conductor 22, the auxiliary conductor patterns 221 are each formed of the copper foil. Each of the via conductors 311, 312, and 313 is formed of a conductive paste such as tin or silver, is solidified at the time of the thermocompression bonding of the base material layers 101, 102, and 103, and becomes a solid conductive body.

As illustrated in FIGS. 1A and 1B and FIG. 3A, the planar or substantially planar conductor 21 and the planar or substantially planar conductor 22 are connected to each other via interlayer conductors 32 extending in the stacking direction. The interlayer conductors 32 are arranged in the vicinity of one end portion EL1 of the multilayer body 100 and spaces are provided therebetween in the second direction.

Specifically, as illustrated in FIGS. 2A to 2C and FIG. 3B, the interlayer conductors 32 each include a via conductor 321 that penetrates the base material layer 101 in the thickness direction and a via conductor 322 that penetrates the base material layer 102 in the thickness direction and these are linked in the stacking direction, thus defining the corresponding interlayer conductor 31. Each of the via conductors 321 and 322 is formed of a conductive paste such as tin or silver, is solidified at the time of the thermocompression bonding of the base material layers 101, 102, and 103, and becomes a solid conductive body.

By adopting such a configuration, the external connection conductor 51 defining and functioning as the first terminal and the external connection conductor 52 defining and functioning as the second terminal are connected to each other by the planar or substantially planar conductor 21. In other words, the external connection conductors 51 and 52 are connected to each other by an inductor L1 including the planar or substantially planar conductor 21.

In addition, the external connection conductor 51 is connected to the planar or substantially planar conductor 22 through the interlayer conductors 32, the external connection conductor 52 is connected to the planar or substantially planar conductor 23 through the interlayer conductors 31, and the planar or substantially planar conductors 22 and 23 face each other through the base material layer 103. In other words, the external connection conductors 51 and 52 are connected to each other by a capacitor C1 defined by the planar or substantially planar conductors 22 and 23 facing each other across the base material layer 103.

Based on this configuration, the external connection conductors 51 and 52, in other words, the first and second terminals are connected to each other by a parallel circuit of the inductor L1 and the capacitor C1. As a result, as illustrated in the equivalent circuit diagram in FIG. 4, a configuration in which the LC parallel resonant circuit of the inductor L1 and the capacitor C1 is connected between the external connection conductors 51 and 52 is provided and the LC parallel resonant element 10 defined by the multilayer body 100 is provided.

In the case of the present preferred embodiment, in the planar or substantially planar conductor 21 defining the inductor L1, the first direction in which the external connection conductors 51 and 52 are linked to each other corresponds to a transmission direction of a high-frequency signal. Accordingly, the second direction corresponds to the width direction of a transmission line. As described above, the planar or substantially planar conductor 21 is long in the second direction (large in width). Accordingly, the direct-current resistance of the inductor L1 becomes small. As a result, the Q value of the inductor L1 becomes high and the Q value of the LC parallel resonant element 10 becomes high. Furthermore, since the length LL1 of the planar or substantially planar conductor 21 in the first direction is short, the direct-current resistance of the inductor L1 becomes lower and it is possible to increase the Q value of the LC parallel resonant element 10.

Furthermore, in the configuration of the present preferred embodiment, by arbitrarily setting the thicknesses of the base material layers 101, 102, and 103, a space (a distance in the thickness direction) D20 between the planar or substantially planar conductors 21 and 22 is made larger than a space (a distance in the thickness direction) D30 between the planar or substantially planar conductors 22 and 23. The space D20 between the planar or substantially planar conductors 21 and is set to, for example, about two times to four times as large as the space D30 between the planar or substantially planar conductors 22 and 23. With this configuration, it is possible to prevent electric field coupling between the planar or substantially planar conductors 21 and 22 while obtaining electric field coupling between the planar or substantially planar conductors 22 and 23. In particular, as described in the present preferred embodiment, the base material layers 101, 102, and 103 are formed of liquid crystalline polymer whose dielectric loss tangent is small. Therefore, it is possible to further prevent the electric field coupling between the planar or substantially planar conductors 21 and 22.

As a result, it is possible to prevent electric field coupling between the capacitor C1 and the inductor L1 and it is possible to further increase the Q values of the inductor L1 and the LC parallel resonant element 10.

In addition, since it is possible to reduce the resistive loss of the capacitor C1 in a case where liquid crystalline polymer is used for the base material layers 101, 102, and 103, it is possible to further increase the Q value as the LC parallel resonant element 10.

In addition, using the LC parallel resonant element 10 of the present preferred embodiment, as illustrated in FIG. 5, compared with an LC parallel resonant element adopting a configuration of the related art, it is possible to realize a band elimination filter whose attenuation characteristic is steep and whose attenuation band width is narrow.

Note that while, in the above-mentioned description, an example in which a pair of planar or substantially planar conductors configuring a capacitor is used is described, two or more pairs of planar or substantially planar conductors configuring a capacitor may be used in order to obtain a desired capacitor. In this case, pairs of planar or substantially planar conductors that face each other across respective base material layers may be stacked in, for example, the stacking direction, and capacitors based on this configuration may be connected in parallel to each other using interlayer conductors.

In addition, the LC parallel resonant element 10 of this configuration preferably is manufactured as follows, for example. First, the one-side copper-plated base material layers 101, 102, and 103 are prepared and patterning processing is performed thereon, thus forming the base material layer 101 in which the planar or substantially planar conductor 21 is formed, the base material layer 102 on which the planar or substantially planar conductor 22 and the auxiliary conductor patterns 221 are formed, and the base material layer 103 on which the planar or substantially planar conductor 23 is formed.

Next, through holes are formed from sides opposite to the forming surfaces of the respective planar or substantially planar conductors 21, 22, and 23 and filled with a conductive paste, for the respective base material layers 101, 102, and 103. Next, the base material layers 101, 102, and 103 are stacked. At this time, the base material layers 101 and 102 are stacked so that a surface on the side opposite to the forming surface of the planar or substantially planar conductor 21 on the base material layer 101 comes in contact with a surface on the side opposite to the forming surface of the planar or substantially planar conductor 22 on the base material layer 102. In addition, the base material layers 102 and 103 are stacked so that a surface on the side opposite to the forming surface of the planar or substantially planar conductor 23 on the base material layer 103 comes in contact with the base material layer 102.

Next, the stacked base material layers 101, 102, and 103 are subjected to thermocompression bonding. At this time, a conductive paste within the through holes is solidified and the interlayer conductors 31 and 32 are formed.

Next, the resist film 41 is formed on the bottom surface of the multilayer body 100, in other words, the forming surface of the planar or substantially planar conductor 21 on the base material layer 101 and the external connection conductors 51 and 52 are formed.

If such a manufacturing method is used, it is possible to easily provide a space between the planar or substantially planar conductors 21 and 22 that is wider than a space between the planar or substantially planar conductors 22 and 23.

Note that, in the above-mentioned description, an example in which planar or substantially planar conductors in respective layers are connected to each other using interlayer conductors is illustrated. However, planar or substantially planar conductor patterns may be formed on surfaces of the two end portions EL1 and EL2 of the multilayer body 100 in the first direction and using the relevant planar or substantially planar conductor patterns, the planar or substantially planar conductors in respective layers may be connected to each other. Using, for example, the planar or substantially planar conductor pattern on the surface of the one end portion EL1 in the first direction, the planar or substantially planar conductors 21 and 22 may be connected to each other, and using, for example, the planar or substantially planar conductor pattern on the surface of the other end portion EL2, the planar or substantially planar conductors 21 and 23 may be connected to each other. In this case, the planar or substantially planar conductor patterns on the surfaces of the relevant two end portions EL1 and EL2 may be used as external connection terminals.

Figure 6:
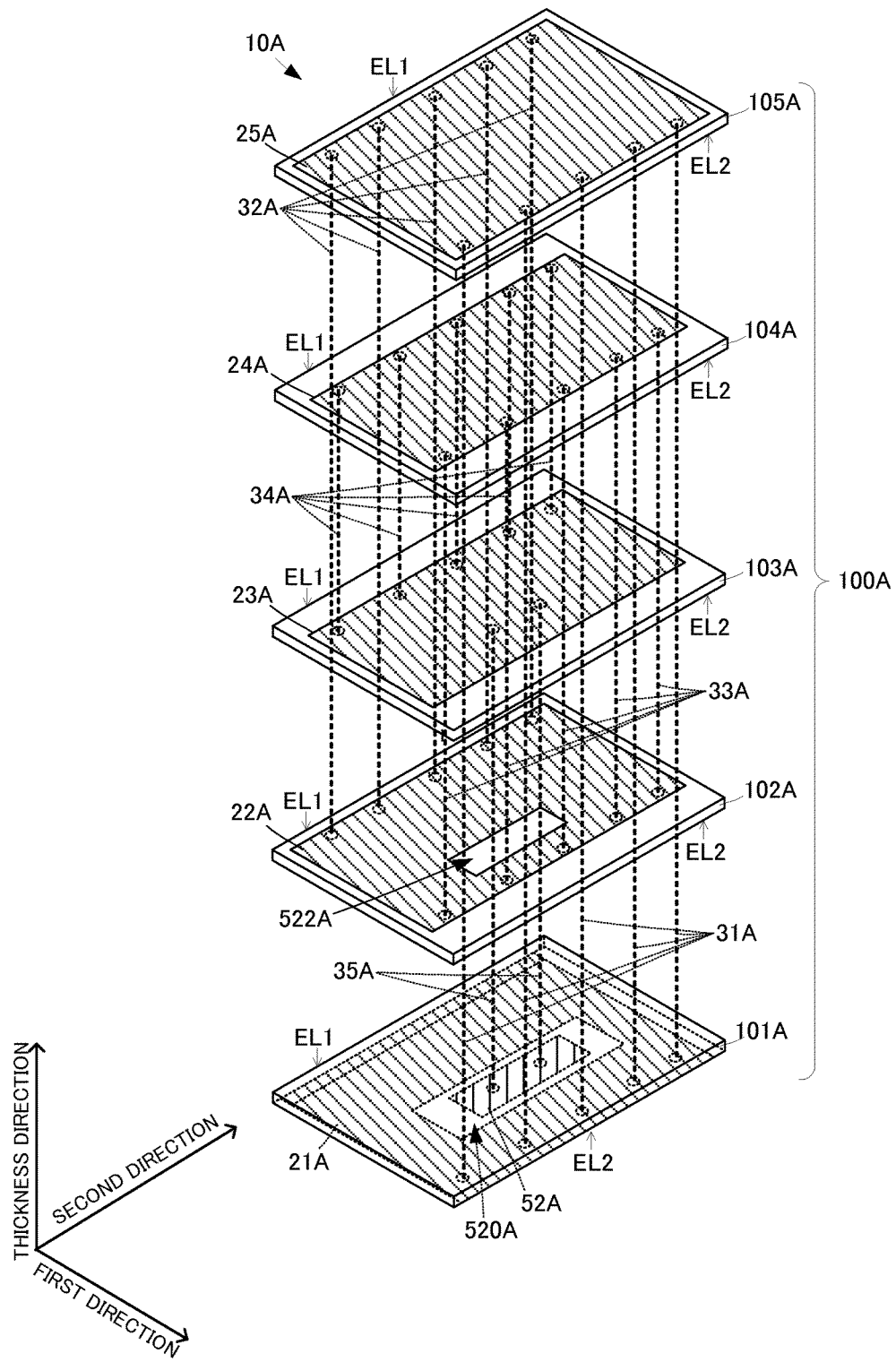
FIG. 6 is an exploded perspective view of an LC parallel resonant element according to a second preferred embodiment of the present invention.
Figure 7:
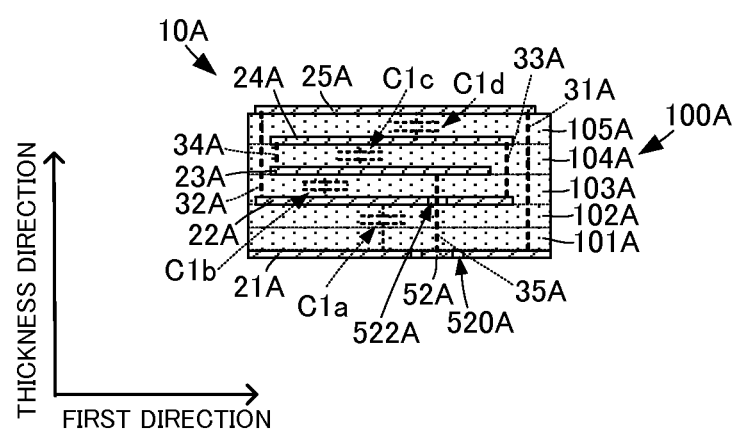
FIG. 7 is a side cross-sectional view of the LC parallel resonant element according to the second preferred embodiment of the present invention.

Next, an LC parallel resonant element according to a second preferred embodiment of the present invention will be described with reference to drawings. FIG. 6 is an exploded perspective view of the LC parallel resonant element according to the second preferred embodiment of the present invention. FIG. 7 is a side cross-sectional view of the LC parallel resonant element according to the second preferred embodiment of the present invention.

As illustrated in FIG. 6, an LC parallel resonant element 10A according to the second preferred embodiment of the present invention includes a multilayer body 100A. The multilayer body 100A has a plate or substantially plate shape, which is rectangular or substantially rectangular and extends in a first direction and a second direction perpendicular to each other. It is preferable that, as illustrated in FIG. 6, a length in the first direction is shorter than a length in the second direction. Note that the length in the second direction is longer than a thickness D.

As illustrated in FIG. 6 and FIG. 7, the multilayer body 100A includes base material layers 101A, 102A, 103A, 104A, and 105A (hereinafter, referred to as 101A-105A in a case of being collectively described). The base material layers 101A-105A are formed of an insulating material and formed of, for example, liquid crystalline polymer. The base material layers 101A-105A are stacked in order of the base material layer 101A, the base material layer 102A, the base material layer 103A, the base material layer 104A, and the base material layer 105A from the bottom surface side of the multilayer body 100A, in a direction perpendicular to the substantially plate surface. The multilayer body 100A is formed by subjecting the base material layers 101A-105A to thermocompression bonding.

On the bottom surface of the base material layer 101A, a planar or substantially planar conductor 21A is provided and the planar or substantially planar conductor 21A is formed of a conductive material such as copper foil. The planar or substantially planar conductor 21A extends over nearly the entire surface of the bottom surface of the base material layer 101A. In a configuration illustrated in the present preferred embodiment, as illustrated in FIG. 6, the planar or substantially planar conductor 21A is configured and arranged so that end portions of the planar or substantially planar conductor 21A are arranged with spaces on a central side from two respective end portions of the base material layer 101A in the second direction. The spaces are, for example, about 10 μm to about 50 μm. Note that the spaces do not have to be provided. In other words, the planar or substantially planar conductor 21A may extend over the entire surface of the bottom surface of the base material layer 101A. In addition, a resist film may be arranged and configured so as to cover a portion other than a first terminal and a second terminal (an external connection conductor 52A) of the planar or substantially planar conductor 21A.

Within the region of the planar or substantially planar conductor 21A, a cutout portion 520A is provided. Within the cutout portion 520A, the external connection conductor 52A is provided. In this case, the external connection conductor 52A is configured and arranged so as not to be in contact with the planar or substantially planar conductor 21A.

On the surface of the base material layer 102A, a planar or substantially planar conductor 22A is provided. As illustrated in FIG. 6, the planar or substantially planar conductor 22A extends over nearly the entire length of the base material layer 102A in the second direction. In this case, in the same way as the planar or substantially planar conductor 21A, the planar or substantially planar conductor 22A is configured and arranged so that end portions of the planar or substantially planar conductor 22A are arranged with spaces on a central side from two respective end portions of the base material layer 102A in the second direction.

In addition, as illustrated in FIG. 6 and FIG. 7, the planar or substantially planar conductor 22A preferably has a shape in which a space from one end portion EL1 of two end portions of the base material layer 102A in the first direction to one of two end portions of the planar or substantially planar conductor 22A is provided (a conductor non-formation portion is provided) and a space from the other end portion EL2 of the base material layer 102A in the first direction to the other end portion of the planar or substantially planar conductor 22A is provided (a conductor non-formation portion is provided). In this case, the space on the other end portion EL2's side is set to a dimension with which it is possible to form interlayer conductors 31A to be described later. As a result, the outer shape of the planar or substantially planar conductor 22A is smaller in area than those of the planar or substantially planar conductor 21A and a substantially planar conductor 25A to be described later and the outer shape of the planar or substantially planar conductor 22A is larger in area than those of substantially planar conductors 23A and 24A to be described later.

Furthermore, as illustrated in FIG. 6 and FIG. 7, within the region of the planar or substantially planar conductor 22A, a cutout portion 522A is provided. The cutout portion 522A preferably has a shape and is located at a position where interlayer conductors 35A to be described later pass through the region of the relevant cutout portion 522A.

On the surface of the base material layer 103A, the planar or substantially planar conductor 23A is provided. As illustrated in FIG. 6, the planar or substantially planar conductor 23A extends over nearly the entire length of the base material layer 103A in the second direction. In this case, in the same way as the planar or substantially planar conductors 21A and 22A, the planar or substantially planar conductor 23A is configured and arranged so that end portions of the planar or substantially planar conductor 23A are arranged with spaces on a central side from two respective end portions of the base material layer 103A in the second direction.

In addition, as illustrated in FIG. 6 and FIG. 7, the planar or substantially planar conductor 23A preferably has a shape in which a space from one end portion EL1 of two end portions of the base material layer 103A in the first direction to one of two end portions of the planar or substantially planar conductor 23A is provided (a conductor non-formation portion is provided) and a space from the other end portion EL2 of the base material layer 103A in the first direction to the other end portion of the planar or substantially planar conductor 23A is provided (a conductor non-formation portion is provided). In this case, the space on the one end portion EL1's side is set to a dimension with which it is possible to form interlayer conductors 32A to be described later. The space on the other end portion EL2's side is set to a dimension with which it is possible to form interlayer conductors 31A and 33A to be described later. As a result, the outer shape of the planar or substantially planar conductor 23A is smaller in area than those of the planar or substantially planar conductors 21A and 22A and the planar or substantially planar conductors 24A and 25A to be described later.

On the surface of the base material layer 104A, the planar or substantially planar conductor 24A is provided. As illustrated in FIG. 6, the planar or substantially planar conductor 24A preferably extends over nearly the entire length of the base material layer 104A in the second direction. In this case, in the same way as the planar or substantially planar conductors 21A, 22A, and 23A, the planar or substantially planar conductor 24A is arranged and configured so that end portions of the planar or substantially planar conductor 24A are arranged with spaces on a central side from two respective end portions of the base material layer 104A in the second direction.

In addition, as illustrated in FIG. 6 and FIG. 7, the planar or substantially planar conductor 24A preferably has a shape in which a space from one end portion EL1 of two end portions of the base material layer 104A in the first direction to one of two end portions of the planar or substantially planar conductor 24A is provided (a conductor non-formation portion is provided) and a space from the other end portion EL2 of the base material layer 104A in the first direction to the other end portion of the planar or substantially planar conductor 24A is provided (a cutout portion is provided). In this case, the space on the one end portion EL1's side is set to a dimension with which it is possible to form the interlayer conductors 32A to be described later. The space on the other end portion EL2's side is set to a dimension with which it is possible to form the interlayer conductors 31A to be described later. As a result, the outer shape of the planar or substantially planar conductor 24A is smaller in area than those of the planar or substantially planar conductors 21A and 22A and the planar or substantially planar conductor 25A to be described later and the outer shape of the planar or substantially planar conductor 24A is larger in area than that of the planar or substantially planar conductor 23A to be described later.

On the surface of the base material layer 105A, the planar or substantially planar conductor 25A is provided. As illustrated in FIG. 6, the planar or substantially planar conductor 25A preferably extends over nearly the entire length in the second direction. In this case, in the same way as the planar or substantially planar conductors 21A, 22A, 23A, and 24A, the planar or substantially planar conductor 25A is arranged and configured so that end portions of the planar or substantially planar conductor 25A are arranged with spaces on a central side from two respective end portions of the base material layer 105A in the second direction. In addition, as illustrated in FIG. 6 and FIG. 7, the planar or substantially planar conductor 25A is arranged and configured so that end portions of the planar or substantially planar conductor 25A are arranged with spaces on a central side from two respective end portions of the base material layer 105A in the first direction. It is preferable that the spaces are, for example, about 10 μm to about 50 μm. As a result, the outer shape of the planar or substantially planar conductor 25A is smaller in area than that of the planar or substantially planar conductor 21A and the outer shape of the planar or substantially planar conductor 25A is larger in area than those of the planar or substantially planar conductors 22A, 23A, and 24A. Note that the area of the outer shape of the planar or substantially planar conductor 25A may be set so as to be equal or substantially equal to that of the planar or substantially planar conductor 21A.

As illustrated in FIG. 6 and FIG. 7, the planar or substantially planar conductor 21A and the planar or substantially planar conductor 25A are connected to each other by the interlayer conductors 31A extended in the stacking direction. The interlayer conductors 31A are arranged in the vicinity of the other end portion EL2 of the multilayer body 100A with spaces therebetween in the second direction.

As illustrated in FIG. 6 and FIG. 7, the planar or substantially planar conductor 25A and the planar or substantially planar conductor 22A are connected to each other by the interlayer conductors 32A extended in the stacking direction. The interlayer conductors 32A are arranged in the vicinity of one end portion EL1 of the multilayer body 100A with spaces therebetween in the second direction.

As illustrated in FIG. 6 and FIG. 7, the planar or substantially planar conductor 22A and the planar or substantially planar conductor 24A are connected to each other by the interlayer conductors 33A extended in the stacking direction. On the other end portion EL2's side of the multilayer body 100A, the interlayer conductors 33A are arranged on a central side in the first direction, compared with the interlayer conductors 31A, with spaces therebetween in the second direction.

As illustrated in FIG. 6 and FIG. 7, the planar or substantially planar conductor 24A and the planar or substantially planar conductor 23A are connected to each other by interlayer conductors 34A extended in the stacking direction. On the one end portion EL1's side of the multilayer body 100A, the interlayer conductors 34A are arranged on a central side in the first direction, compared with the interlayer conductors 32A, with spaces therebetween in the second direction.

As illustrated in FIG. 6 and FIG. 7, the planar or substantially planar conductor 23A and the external connection conductor 52A are connected to each other by the interlayer conductors 35A extended in the stacking direction. The interlayer conductors 35A are arranged at positions between the interlayer conductors 33A and 34A in the first direction with a space therebetween in the second direction.

By adopting such a configuration, the planar or substantially planar conductor 21A doubling as an external connection conductor in one end portion of two end portions and the external connection conductor 52A, which are provided on the bottom surface of the multilayer body 100A, are connected to each other by a transmission line that passes through the interlayer conductors 31A, the planar or substantially planar conductor 25A, the interlayer conductors 32A, the planar or substantially planar conductor 22A, the interlayer conductors 33A, the planar or substantially planar conductor 24A, the interlayer conductors 34A, the planar or substantially planar conductor 23A, and the interlayer conductors 35A in this order. Furthermore, by setting, as an external connection conductor portion, an end portion on the one end portion EL1's side of the planar or substantially planar conductor 21A, the relevant external connection conductor portion and the external connection conductor 52A are connected to each other by a transmission line that passes through the planar or substantially planar conductor 21A, the interlayer conductors 31A, the planar or substantially planar conductor 25A, the interlayer conductors 32A, the planar or substantially planar conductor 22A, the interlayer conductors 33A, the planar or substantially planar conductor 24A, the interlayer conductors 34A, the planar or substantially planar conductor 23A, and the interlayer conductors 35A in this order.

Furthermore, by adopting such a configuration, a configuration in which a pair of planar or substantially planar conductors, connected to each other by interlayer conductors, and the relevant interlayer conductors surround one or more planar or substantially planar conductors sandwiched by the relevant pair of planar or substantially planar conductors in the stacking direction is formed. Specifically, the planar or substantially planar conductors 21A and 25A and the interlayer conductors 31A surround the planar or substantially planar conductors 22A, 23A, and 24A. Furthermore, within a region surrounded by the planar or substantially planar conductors 21A and 25A and the interlayer conductors 31A, the planar or substantially planar conductors 25A and 22A and the interlayer conductors 32A surround the planar or substantially planar conductors 23A and 24A. Furthermore, within a region surrounded by the planar or substantially planar conductors 25A and 22A and the interlayer conductors 32A, the planar or substantially planar conductors 22A and 24A and the interlayer conductors 33A surround the planar or substantially planar conductor 23A.

With this configuration, as illustrated in the side cross-sectional view in FIG. 7, the transmission line defined by the above-mentioned substantially planar conductors 21A to 25A and the interlayer conductors 31A to 34A has a spiral or substantially spiral shape that originates on the planar or substantially planar conductor 21A's side and winds from the outer surface of the multilayer body 100A toward the center thereof.

Accordingly, this transmission line defines and functions as a wide-width inductor L1A of a substantially spiral shape. In addition, since the individual planar or substantially planar conductors 21A, 22A, 23A, 24A, and 25A that configure the relevant inductor L1A face each other in the stacking direction, individual facing portions therebetween define and function as capacitors. Specifically, as illustrated in FIG. 7, the facing portion between the planar or substantially planar conductors 21A and 22A defines and functions as a capacitor C1a, the facing portion between the planar or substantially planar conductors 22A and 23A defines and functions as a capacitor C1b, the facing portion between the planar or substantially planar conductors 23A and 24A defines and functions as a capacitor C1c, and the facing portion between the planar or substantially planar conductors 24A and 25A defines and functions as a capacitor C1d.

Accordingly, a circuit configuration, in which a combined capacitor C1A including a combination of the capacitors C1a, C1b, C1c, and C1d is connected between the external connection conductor portion of the planar or substantially planar conductor 21A and the external connection conductor 52A, is provided. Therefore, a configuration where an LC parallel resonant circuit, in which the inductor L1A and the capacitor C1A are connected in parallel to each other, is connected between the external connection conductor portion of the planar or substantially planar conductor 21A and the external connection conductor 52A is provided. As a result, an LC parallel resonant circuit equivalent to the equivalent circuit diagram in FIG. 4 is provided and the LC parallel resonant element 10A defined by the multilayer body 100A is provided.

In addition, in the case of the configuration of the present preferred embodiment, a portion defining the inductor L1A has a shape long in the second direction, in other words, a shape in which the width of the transmission line is wide. As a result, in the same way as the inductor L1 of the first preferred embodiment, the Q value of the inductor L1A becomes high and the Q value of the LC parallel resonant element 10A becomes high.

Note that, in the present preferred embodiment, an example in which the planar or substantially planar conductors in the respective layers are connected to each other by the interlayer conductors so as to have a spiral or substantially spiral shape when viewed from the side is illustrated. However, a form in which the planar or substantially planar conductors in the respective layers are connected to each other by the interlayer conductors so as to have a meander or substantially meander shape may be adopted. In this regard, however, by setting to the spiral or substantially spiral shape, it is possible to provide a hollow core portion whose axis direction is the second direction. Therefore, it is possible to increase the Q value of the inductor, compared with a case of being set to the meander or substantially meander shape.

Figure 8:
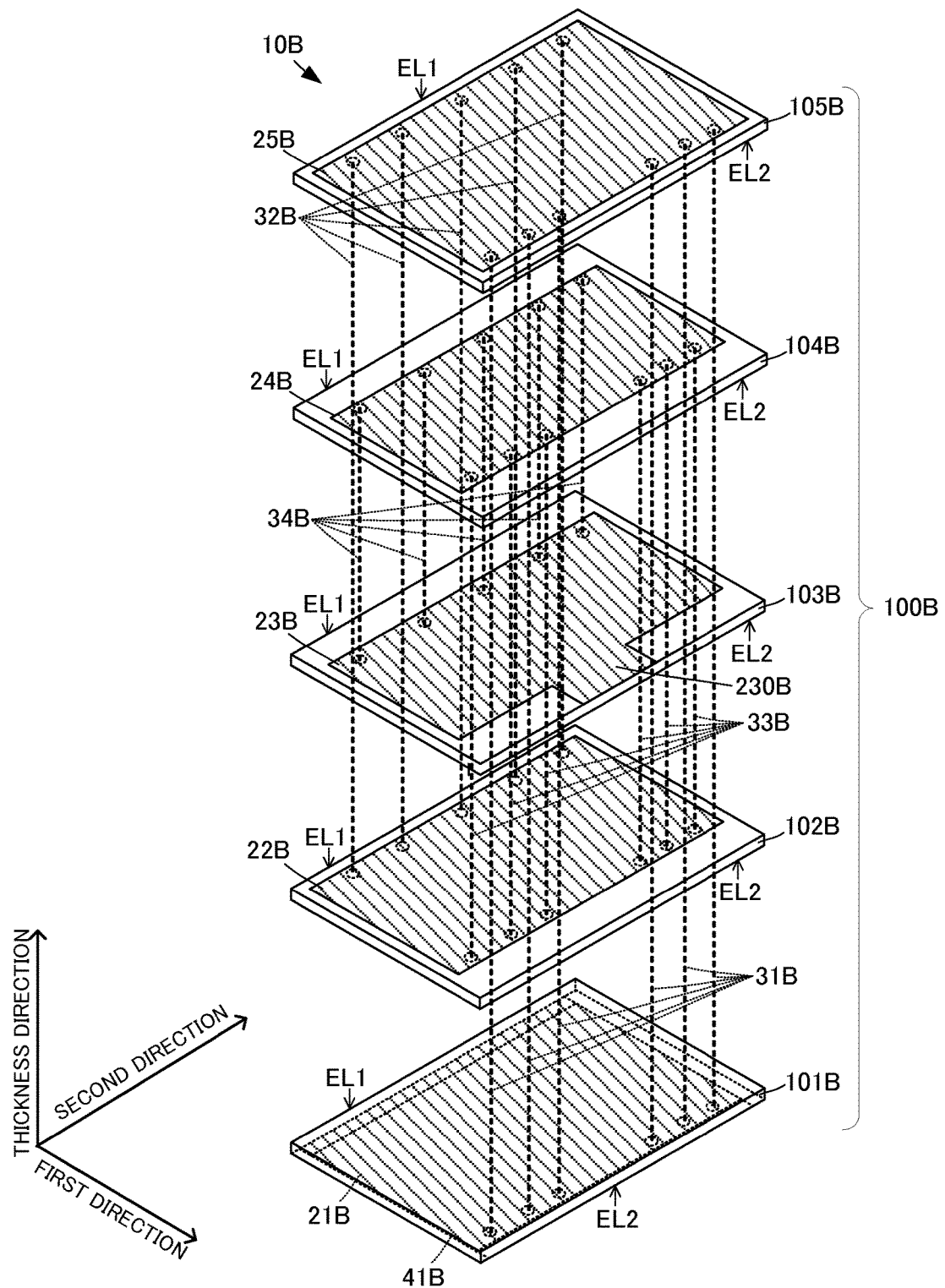
FIG. 8 is an exploded perspective view of an LC parallel resonant element according to a third preferred embodiment of the present invention.
Figure 9:
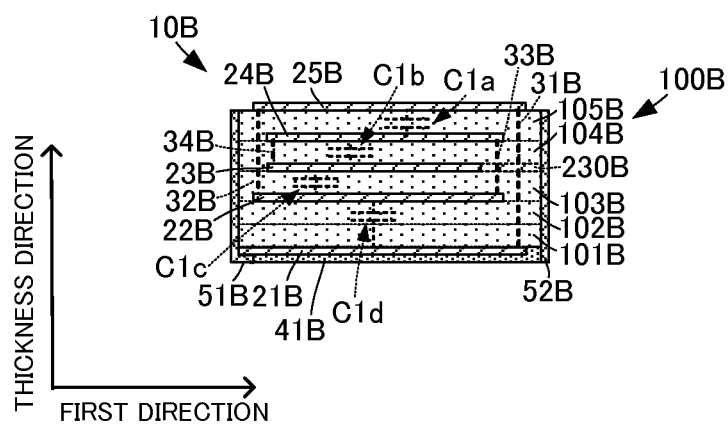
FIG. 9 is a side cross-sectional view of the LC parallel resonant element according to the third preferred embodiment of the present invention.

Next, an LC parallel resonant element according to a third preferred embodiment of the present invention will be described with reference to drawings. FIG. 8 is an exploded perspective view of the LC parallel resonant element according to the third preferred embodiment of the present invention. FIG. 9 is a side cross-sectional view of the LC parallel resonant element according to the third preferred embodiment of the present invention.

In an LC parallel resonant element 10B according to the present preferred embodiment, the shape of an external connection conductor and a configuration of connecting to the relevant external connection conductor are different from those of the LC parallel resonant element 10A according to the second preferred embodiment and other configurations are preferably the same as those of the LC parallel resonant element 10A according to the second preferred embodiment. Therefore, only points different from the LC parallel resonant element 10A according to the second preferred embodiment will be specifically described.

As illustrated in FIG. 8 and FIG. 9, a multilayer body 100B includes base material layers 101B to 105B. The base material layers 101B to 105B are formed of an insulating material and formed of, for example, liquid crystalline polymer.

On the bottom surface of the base material layer 101B, a planar or substantially planar conductor 21B is provided and the planar or substantially planar conductor 21B is formed of a conductive material such as copper foil. The planar or substantially planar conductor 21B extends over nearly the entire surface of the bottom surface of the base material layer 101B. As illustrated in FIG. 8, in a configuration illustrated in the present preferred embodiment, the planar or substantially planar conductor 21B is arranged and configured so that end portions of the planar or substantially planar conductor 21B are arranged with spaces on a central side from two respective end portions of the base material layer 101B in the second direction.

As illustrated in FIG. 8 and FIG. 9, the planar or substantially planar conductor 21B is arranged and configured so as to lead to one end portion EL1 of two end portions of the base material layer 101B in the first direction. The planar or substantially planar conductor 21B preferably has a shape in which a space from the other end portion EL2 of the base material layer 101B in the first direction to the other end portion of two end portions of the planar or substantially planar conductor 21B is provided (a conductor non-formation portion is provided).

Furthermore, as illustrated in FIG. 8 and FIG. 9, on the bottom surface of the base material layer 101B, a resist film 41B of insulation is provided. The resist film 41B preferably has a shape that causes an end portion on one end portion EL1's side of the planar or substantially planar conductor 21B to be exposed and covers another region.

As illustrated in FIG. 8 and FIG. 9, a planar or substantially planar conductor 23B disposed on the surface of the base material layer 103B includes a main body portion equal to the planar or substantially planar conductor 23A illustrated in the second preferred embodiment and an extending conductor portion 230B. The extending conductor portion 230B is located approximately at the center in the second direction with a predetermined width. The extending conductor portion 230B preferably has a strip or substantially strip shape that leads from the main body portion of the planar or substantially planar conductor 23B to a surface on the other end portion EL2's side of the multilayer body 100B.

An external connection conductor 51B is provided on a surface on one end portion EL1's side of the multilayer body 100B. The external connection conductor 51B is connected to the planar or substantially planar conductor 21B. An external connection conductor 52B is provided on a surface on the other end portion EL2's side of the multilayer body 100B. The external connection conductor 52B is connected to the extending conductor portion 230B.

Even in such a configuration, in the same way as the above-mentioned second preferred embodiment, it is possible to configure an LC parallel resonant circuit in which the inductor of a spiral or substantially spiral shape and a capacitor are connected in parallel to each other.

Figure 10A:
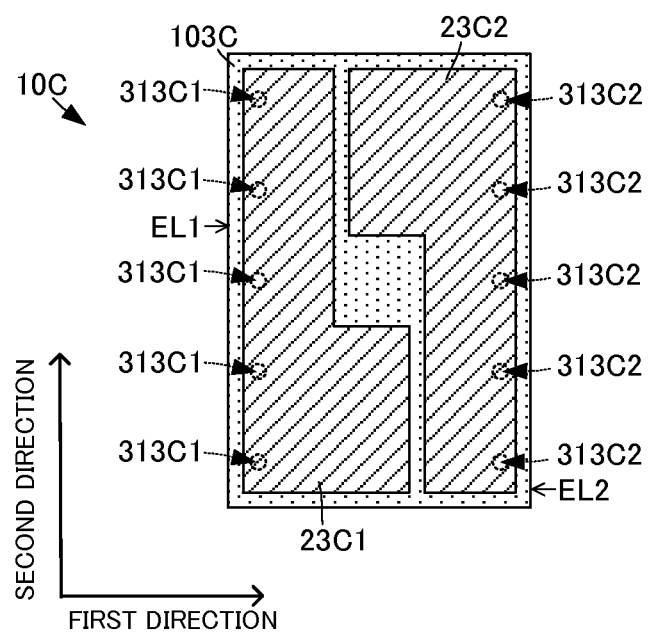
FIGS. 10A to 10C are diagrams in which respective base material layers of an LC parallel resonant element according to a fourth preferred embodiment of the present invention are viewed in plan.
Figure 10B:
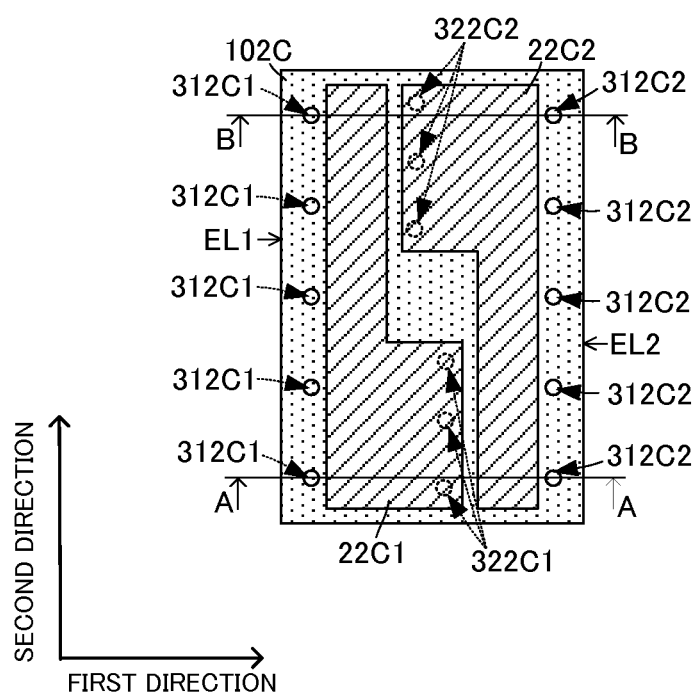
Figure 10C:
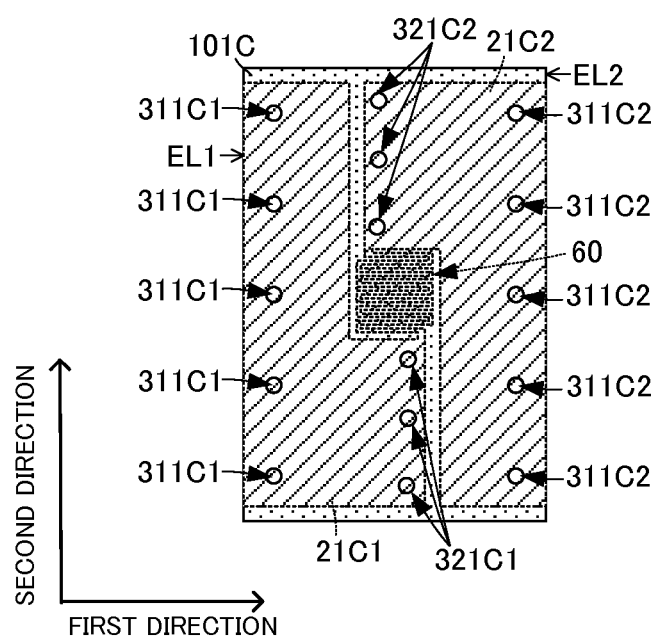
Figure 11A:
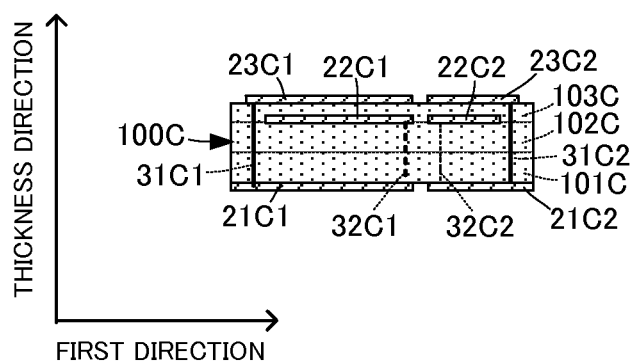
FIGS. 11A and 11B are side cross-sectional views of the LC parallel resonant element according to the fourth preferred embodiment of the present invention.
Figure 11B:
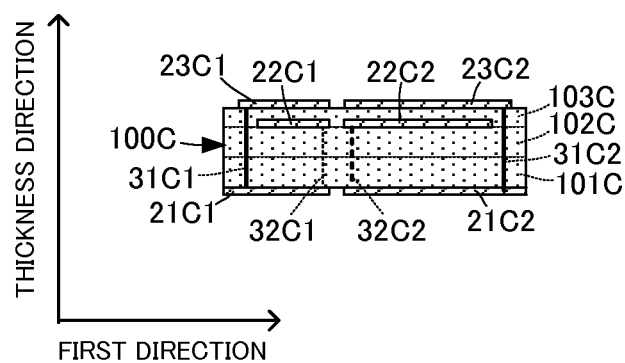
Figure 12:
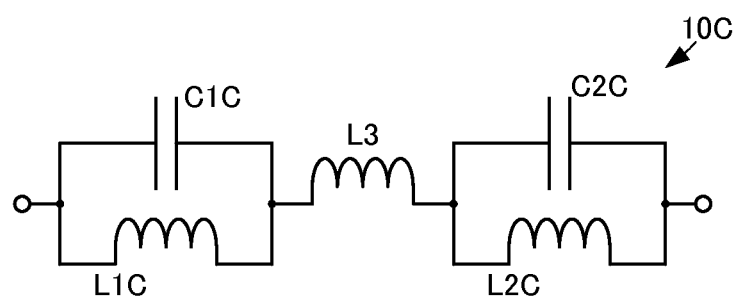
FIG. 12 is an equivalent circuit diagram of the LC parallel resonant element according to the fourth preferred embodiment of the present invention.

Next, an LC parallel resonant element according to a fourth preferred embodiment of the present invention will be described with reference to drawings. FIGS. 10A to 10C are diagrams in which respective base material layers of the LC parallel resonant element according to the fourth preferred embodiment of the present invention are viewed in plan. FIGS. 11A and 11B are side cross-sectional views of the LC parallel resonant element according to the fourth preferred embodiment of the present invention. FIG. 11A illustrates a cross-section taken along a line XIA-XIA in FIG. 10B and FIG. 11B illustrates a cross-section taken along a line XIB-XIB in FIG. 10B. FIG. 12 is an equivalent circuit diagram of the LC parallel resonant element according to the fourth preferred embodiment of the present invention.

In each of the LC parallel resonant elements of the above-mentioned preferred embodiments, an example in which one LC parallel resonant circuit is configured within one multilayer body is illustrated. However, in the LC parallel resonant element of the present preferred embodiment, LC parallel resonant circuits (two LC parallel resonant circuits) are provided within one multilayer body. Note that the basic configuration of each of the LC parallel resonant circuits is preferably the same as that of the LC parallel resonant element according to the first preferred embodiment. Therefore, in what follows, only points different from the LC parallel resonant element according to the first preferred embodiment will be specifically described.

A multilayer body 100C is formed preferably by stacking base material layers 101C, 102C, and 103C.

On the bottom surface of the base material layer 101C, substantially planar conductors 21C1 and 21C2 are formed. The planar or substantially planar conductors 21C1 and 21C2 are formed with a space therebetween in the first direction.

On the surface of the base material layer 102C, planar or substantially planar conductors 22C1 and 22C2 are formed. The planar or substantially planar conductors 22C1 and 22C2 are formed with a space therebetween in the first direction. The planar or substantially planar conductor 22C1 is formed at a position of not facing the planar or substantially planar conductor 21C2 and the planar or substantially planar conductor 22C2 is formed at a position of not facing the planar or substantially planar conductor 21C1.

On the surface of the base material layer 103C, substantially planar conductors 23C1 and 23C2 are formed. The planar or substantially planar conductors 23C1 and 23C2 are formed with a space therebetween in the first direction. The planar or substantially planar conductor 23C1 is formed at a position of facing the planar or substantially planar conductor 22C1 and not facing the planar or substantially planar conductor 22C2. The planar or substantially planar conductor 23C2 is formed at a position of facing the planar or substantially planar conductor 22C2 and not facing the planar or substantially planar conductor 22C1.

The planar or substantially planar conductor 21C1 and the planar or substantially planar conductor 23C1 are connected to each other by interlayer conductors 31C1. The interlayer conductors 31C1 are formed in the vicinity of one end portion EL1 of two ends portions of the multilayer body 100C. The planar or substantially planar conductor 21C1 and the planar or substantially planar conductor 22C1 are connected to each other by interlayer conductors 32C1. The interlayer conductors 32C1 are formed in the vicinity of end portions on the other end portion EL2's side in the planar or substantially planar conductors 21C1 and 22C1. With this configuration, an LC parallel resonant circuit of an inductor L1C and a capacitor C1C illustrated in FIG. 12 is provided.

The planar or substantially planar conductor 21C2 and the planar or substantially planar conductor 23C2 are connected to each other by interlayer conductors 31C2. The interlayer conductors 31C2 are formed in the vicinity of the other end portion EL2 of two ends portions of the multilayer body 100C. The planar or substantially planar conductor 21C2 and the planar or substantially planar conductor 22C2 are connected to each other by interlayer conductors 32C2. The interlayer conductors 32C2 are formed in the vicinity of end portions on the one end portion EL1' side in the planar or substantially planar conductors 21C2 and 22C2. With this configuration, an LC parallel resonant circuit of an inductor L2C and a capacitor C2C illustrated in FIG. 12 is provided.

Furthermore, as illustrated in FIG. 10C, in an LC parallel resonant element 10C of the present preferred embodiment, a meander or substantially meander shaped conductor pattern 60 is provided on the bottom surface of the base material layer 101C. The meander or substantially meander shaped conductor pattern 60 is connected to the planar or substantially planar conductor 21C1 and the planar or substantially planar conductor 21C2. Based on this meander or substantially meander shaped conductor pattern 60, an inductor L3 illustrated in FIG. 12 is provided.

Based on such a configuration as described above, as illustrated in FIG. 12, it is possible to realize the LC parallel resonant element 10C in which the LC parallel resonant circuit of the inductor L1C and the capacitor C1C and the LC parallel resonant circuit of the inductor L2C and the capacitor C2C are connected to each other by the inductor L3.

Note that while not illustrated, a resist film of insulation preferably is provided on the bottom surface of the base material layer 101C, the one end portion EL1's side of the planar or substantially planar conductor 21C1 is exposed, and the other end portion EL2's side of the planar or substantially planar conductor 21C2 is exposed, thus enabling two external connection conductors of this LC parallel resonant element 10C to be provided.

Using such a configuration, it is possible to provide two or more LC parallel resonant circuits in one multilayer body.

Furthermore, as illustrated in the present preferred embodiment, by adopting the meander or substantially meander shaped inductor as an inductor to connect two LC parallel resonant circuits to each other, it is possible to realize an inductor whose inductance is high. In this configuration, in a case where an LC series resonant circuit based on the inductor of one of two LC parallel resonant circuits and the capacitor of the other LC parallel resonant circuit is configured, the relevant meander or substantially meander shaped inductor is included in the LC series resonant circuit. Therefore, it is possible to keep the resonant frequency of the relevant LC series resonant circuit away from the attenuation pole frequency of the LC parallel resonant circuit. As a result, even in a case where a band elimination filter is configured by connecting in series two or more LC parallel resonant circuits to each other, it is possible to prevent influence of unnecessary resonance on an attenuation characteristic, the unnecessary resonance being due to the series connection of the two or more LC parallel resonant circuits.

Note that, while, in each of the above-mentioned preferred embodiments, a case where the length in the second direction preferably is longer than the length in the first direction is described, the length in the second direction may be less than or equal to the length in the first direction. In this regard, however, it is suitable for various preferred embodiments of the present invention that the length in the second direction is longer than the length in the first direction.

Figure 13:
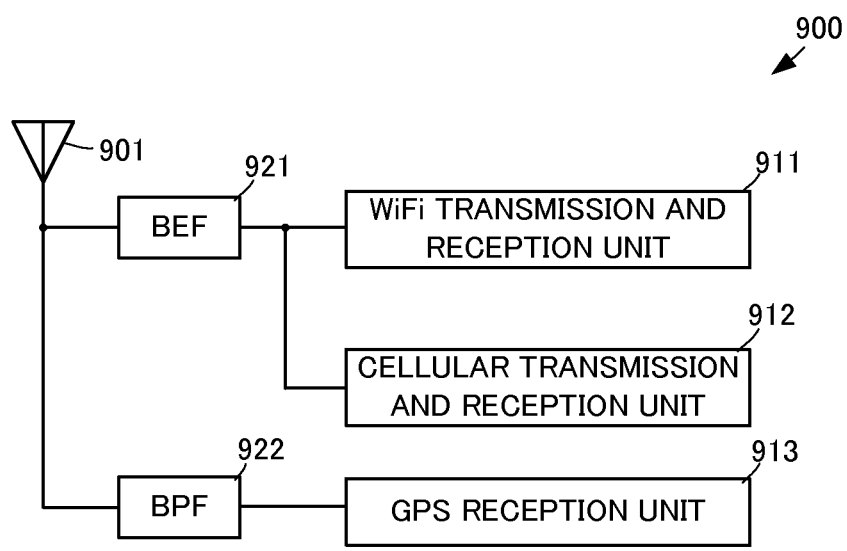
FIG. 13 is a block diagram of a communication device according to a fifth preferred embodiment of the present invention.

Next, a communication device according to a fifth preferred embodiment of the present invention will be described with reference to a drawing. FIG. 13 is a block diagram of the communication device according to the fifth preferred embodiment of the present invention.

As illustrated in FIG. 13, a communication device 900 of the present preferred embodiment includes an antenna 901, a WiFi transmission and reception unit 911, a cellular transmission and reception unit 912, a GPS reception unit 913, a band elimination filter (BEF) 921, and a band pass filter (BPF) 922.

The antenna 901 is connected to the WiFi transmission and reception unit 911 and the cellular transmission and reception unit 912 through the band elimination filter 921. In addition, the antenna 901 is connected to the GPS reception unit 913 through the band pass filter 922.

The WiFi transmission and reception unit 911 transmits and receives WiFi communication signals utilizing a frequency band such as, for example, about 2.4 GHz band. The cellular transmission and reception unit 912 transmits and receives cellular communication signals utilizing a frequency band such as, for example, about 900 MHz band or a frequency band such as, for example, about 1.9 GHz band. The GPS reception unit 913 receives GPS signals near about 1.5 GHz.

The band elimination filter 921 attenuates the frequency band of the GPS signals and causes the frequency bands of the WiFi communication signals and the cellular communication signals to pass therethrough. The band pass filter 922 causes the frequency band of the GPS signals to pass therethrough and attenuates frequency bands other than the frequency band of the GPS signals.

As this band elimination filter 921, the LC parallel resonant element illustrated in one of the above-mentioned individual preferred embodiments is used. Using this LC parallel resonant element, it is possible to realize a band elimination filter whose attenuation characteristic is steep and whose stop band is narrow. Therefore, if an attenuation pole is set in the frequency band of the GPS signals, it is possible to attenuate the GPS signals and to transmit other communication signals (for example, the about 1.9 GHz band of the cellular communication signals) and so forth, located near the relevant frequency band of the GPS signals, while not attenuating the other communication signals.

Furthermore, since it is possible to realize the band elimination filter 921 using one multilayer body in such a manner as described above, it is possible for the band elimination filter 921 to have a small size. As a result, it is possible to downsize the communication device 900 while not deteriorating communication characteristics.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. An LC parallel resonant element comprising:
a multilayer body including a plurality of insulating base material layers stacked on top of one another;
a first terminal and a second terminal arranged separately from each other in a first direction of the multilayer body on one main surface of the multilayer body;
a first planar or substantially planar conductor that functions as an inductor;
a pair of second planar or substantially planar conductors that face each other in a stacking direction of the multilayer body and are provided on layers different from a base material layer on which the first planar or substantially planar conductor is provided;
a first interlayer conductor, connected to one side of the first planar or substantially planar conductor in the first direction of the multilayer body, extending in the stacking direction and continuously connecting one of the pair of second planar or substantially planar conductors and the first terminal to each other; and
a second interlayer conductor, connected to another side of the first planar or substantially planar conductor in the first direction of the multilayer body, extending in the stacking direction and continuously connecting the other of the pair of second planar or substantially planar conductors and the second terminal to each other; wherein
the first planar or substantially planar conductor is located on the one main surface of the multilayer body and electrically connects the first terminal and the second terminal;
a direction perpendicular to the first direction and to the stacking direction is defined as a second direction; and
a length of the first planar or substantially planar conductor in the first direction is shorter than a length of the first planar or substantially planar conductor in the second direction.

2. The LC parallel resonant element according to claim 1, wherein a space between a planar conductor out of the pair of second planar or substantially planar conductors and the first planar or substantially planar conductor, the planar conductor out of the pair of second planar or substantially planar conductors being located on a side near the first planar or substantially planar conductor, is wider than a space between the pair of second planar or substantially planar conductors facing each other.

3. The LC parallel resonant element according to claim 2, wherein the space between one of the pair of second planar or substantially planar conductors and the first planar or substantially planar conductor is two to four times wider than the space between the pair of second planar or substantially planar conductors facing each other, the one of the pair of second planar or substantially planar conductors being located on a side near the first planar or substantially planar conductor.

4. The LC parallel resonant element according to claim 1, wherein the length of the first planar or substantially planar conductor in the second direction is equal or substantially equal to a length of the base material layer in the second direction.

5. The LC parallel resonant element according to claim 1, wherein an area of at least one of the pair of second planar or substantially planar conductors is less than an area of the first planar or substantially planar conductor.

6. The LC parallel resonant element according to claim 1, wherein at least one of the first and second interlayer conductors includes at least one of a via conductor and an auxiliary conductor.

7. A band elimination filter comprising the LC parallel resonant element according to claim 1.

8. A communication device comprising the band elimination filter according to claim 7.

9. An LC parallel resonant element comprising:
a multilayer body including a plurality of insulating base material layers stacked on top of one another;
a first terminal and a second terminal that are arranged on an outer surface of the multilayer body and separately from each other in a first direction of the multilayer body on one main surface of the multilayer body;
a plurality of planar or substantially planar conductors that are provided at different positions in a stacking direction of the multilayer body and each has one single segment and a plane surface perpendicular to the stacking direction; and
interlayer conductors that connect the plurality of planar or substantially planar conductors; wherein
a number of the plurality of planar or substantially planar conductors is three or more;
one of two planar or substantially planar conductors of the plurality of planar or substantially planar conductors adjacent to each other in the stacking direction and located on a central side in the stacking direction is smaller in area than the other and defines an electrode of a capacitor;
the interlayer conductors and the plurality of planar or substantially planar conductors form an inductor connected between the first terminal and the second terminal;
a direction perpendicular to the first direction and to the stacking direction is defined as a second direction; and
a length of the plurality of planar or substantially planar conductors in the first direction is shorter than a length of the plurality of planar or substantially planar conductors in the second direction.

10. The LC parallel resonant element according to claim 9, wherein at least one of the plurality of planar or substantially planar conductors extends along an entire surface of the respective base material layer.

11. The LC parallel resonant element according to claim 9, wherein a cutout is provided near one of the plurality of planar or substantially planar conductors in which an external connection conductor is provided so as not to be in contact with the one of the plurality of planar or substantially planar conductors.

12. The LC parallel resonant element according to claim 9, wherein the multilayer body includes a transmission line that passes through the plurality of planar or substantially planar conductors and that connects the plurality of planar or substantially planar conductors, the interlayer conductors and the first and second terminals.

13. The LC parallel resonant element according to claim 12, wherein the transmission line has a spiral or substantially spiral shape extending from an outer surface of the multilayer body toward a center thereof.

14. The LC parallel resonant element according to claim 9, wherein at least one of the plurality of planar or substantially planar conductors includes end portions located on the central side and spaced from two respective end portions of the respective base material layer.

15. The LC parallel resonant element according to claim 9, wherein the first direction is perpendicular to the stacking direction.

16. A band elimination filter comprising the LC parallel resonant element according to claim 9.

17. A communication device comprising the band elimination filter according to claim 16.

18. An LC parallel resonant element comprising:
- a multilayer body including a plurality of insulating base material layers stacked on top of one another;
- a first terminal and a second terminal that are arranged on an outer surface of the multilayer body and separately from each other in a first direction of the multilayer body on one main surface of the multilayer body;
- a plurality of planar or substantially planar conductors that are provided at different positions in a stacking direction of the multilayer body and each has a plane surface perpendicular to the stacking direction; and
- interlayer conductors that connect the plurality of planar or substantially planar conductors; wherein
- the interlayer conductors and the plurality of planar or substantially planar conductors form an inductor connected between the first terminal and the second terminal;
- the inductor has a spiral or substantially spiral shape extending from the outer surface of the multilayer body toward a center of the multilayer body and an end of the spiral or substantially spiral shape is enclosed by the plurality of planar or substantially planar conductors and is disposed closer to the center of the multilayer body than to the outer surface when viewing the multilayer body in a direction perpendicular to the stacking direction;
- a direction perpendicular to the first direction and to the stacking direction is defined as a second direction; and
- a length of the plurality of planar or substantially planar conductors in the first direction is shorter than a length of the plurality of planar or substantially planar conductors in the second direction.

19. A band elimination filter comprising the LC parallel resonant element according to claim 18.

20. A communication device comprising the band elimination filter according to claim 19.

21. The LC parallel resonant element according to claim 18, wherein
the first direction is perpendicular to the stacking direction.

* * * * *